US010930589B2

(12) United States Patent
Maniscalco et al.

(10) Patent No.: US 10,930,589 B2
(45) Date of Patent: Feb. 23, 2021

(54) ADVANCED INTERCONNECTS CONTAINING AN IMT LINER

(71) Applicant: International Business Machines Corporation, Armonk, NY (US)

(72) Inventors: Joseph F. Maniscalco, Lake Katrine, NY (US); Andrew Tae Kim, Poughkeepsie, NY (US); Baozhen Li, South Burlington, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/585,672

(22) Filed: Sep. 27, 2019

(65) Prior Publication Data
US 2020/0027829 A1 Jan. 23, 2020

Related U.S. Application Data

(62) Division of application No. 15/948,809, filed on Apr. 9, 2018, now Pat. No. 10,468,346.

(51) Int. Cl.
*H01L 23/525* (2006.01)
*H01L 23/532* (2006.01)
*H01L 21/768* (2006.01)

(52) U.S. Cl.
CPC ...... *H01L 23/5252* (2013.01); *H01L 21/7684* (2013.01); *H01L 21/76846* (2013.01);
(Continued)

(58) Field of Classification Search
CPC ............ H01L 23/5252; H01L 21/7684; H01L 21/76846; H01L 21/76847
See application file for complete search history.

(56) References Cited

U.S. PATENT DOCUMENTS 5,926,738 A    7/1999  Cronin et al.
6,417,572 B1   7/2002  Chidambarrao et al.
(Continued)

FOREIGN PATENT DOCUMENTS

WO    2017111876 A1    6/2017

OTHER PUBLICATIONS

Pergament, A., et al., "Vanadium Dioxide: Metal-Insulator Transition, Electrical Switching and Oscillations. A Review of State of the Art and Recent Progress", Energy Materials and Nanotechnology (EMN) Meeting on Computation and Theory, Nov. 9-12, 2015, 25 pages, Istanbul (Turkey).

(Continued)

*Primary Examiner* — Elias Ullah
(74) *Attorney, Agent, or Firm* — Scully, Scott, Murphy & Presser, P.C.; L. Jeffrey Kelly, Esq.

(57) ABSTRACT

An interconnect structure is provided that includes a liner located between an electrically conductive structure and an interconnect dielectric material layer. The liner is composed of a phase change material that is insulating at a first temperature, and becomes conductive at a second temperature that is higher than the first temperature. The liner that is composed of such a phase change material is referred to as an "insulator-to/from metal transition (IMT)" liner. In the present application, an entirety of, or a portion of, the IMT liner may be changed from an insulating phase to a conductive phase by increasing the temperature (i.e., heating) of the liner so as to provide a redundancy path in which electrons can flow.

18 Claims, 6 Drawing Sheets

(52) U.S. Cl.
CPC .. *H01L 21/76847* (2013.01); *H01L 23/53238* (2013.01); *H01L 23/53252* (2013.01); *H01L 23/53266* (2013.01)

(56) References Cited

U.S. PATENT DOCUMENTS

| | | |
|---|---|---|
| 6,992,390 B2 | 1/2006 | Edelstein et al. |
| 7,315,998 B2 | 1/2008 | Fischer et al. |
| 9,620,611 B1 | 4/2017 | Clifton |
| 2009/0230555 A1 | 9/2009 | Chapple-Sokol et al. |

OTHER PUBLICATIONS

Mott, et al.,. Metal-insulator transition in Ti2O3, Journal de Physique, Feb. 1981, pp. 277-281, 42 (2).
List of IBM Patents or Patent Applications Treated As Related Dated Sep. 27, 2019, 2 Pages.

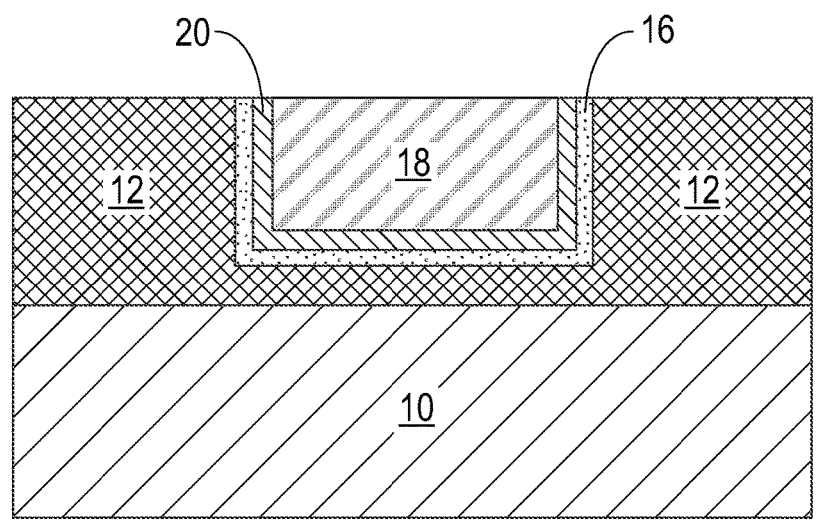
FIG. 11
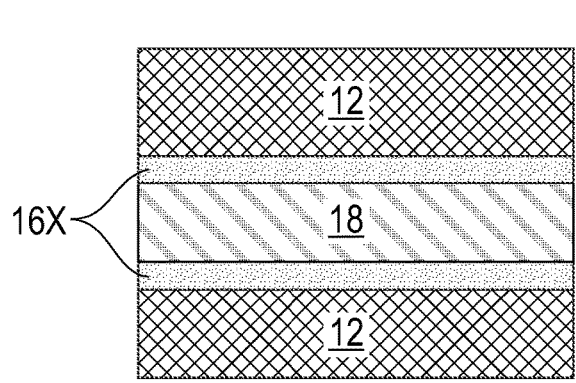 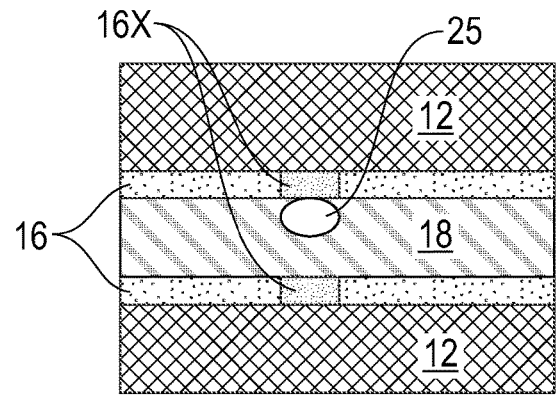
FIG. 12 FIG. 13

ADVANCED INTERCONNECTS CONTAINING AN IMT LINER

BACKGROUND

The present application relates to back-end-of-the-line (BEOL) technology. More particularly, the present application relates to an interconnect structure including a liner located between an electrically conductive structure and an interconnect dielectric material layer that is composed of a phase change material that is insulating at a first temperature, and becomes conductive at a second temperature that is higher than the first temperature.

Generally, BEOL interconnect devices include a plurality of circuits which form an integrated circuit fabricated on an interconnect substrate. A complex network of signal paths will normally be routed to connect the circuit elements distributed on the surface of the substrate. Efficient routing of these signals across the device requires formation of multilevel or multilayered schemes, such as, for example, single or dual damascene wiring, i.e., interconnect, structures.

Within typical interconnect structures, electrically conductive metal vias run perpendicular to the interconnect substrate and electrically conductive metal lines run parallel to the interconnect substrate. Typically, the electrically conductive metal vias are present beneath the electrically conductive metal lines and both features are embedded within an interconnect dielectric material layer.

In conventional interconnect structures, copper or a copper containing alloy has been used as the material of the electrically conductive metal or metal alloy of the electrically conductive structure that is embedded in an interconnect dielectric material. Conventional interconnect structures may also include various liners such as, for example, metallic liners, and/or diffusion barrier liners. Conventional liners are composed of materials (either conductive or insulating) that do not undergo any phase change upon heating of the interconnect structure. Thus, the conventional liners are not used to provide a redundancy electrical path when the temperature of the interconnect structure increases. Also, conventional liners cannot used to provide a local redundancy electrical path when an electromigration event occurs. There is thus a need for providing a liner material for an interconnect structure that can provide either a redundancy electrical path or a localized redundancy electrical path.

SUMMARY

An interconnect structure is provided that includes a liner located between an electrically conductive structure and an interconnect dielectric material layer. The liner is composed of a phase change material that is insulating at a first temperature, and becomes conductive at a second temperature that is higher than the first temperature. The liner that is composed of such a phase change material is referred to as an "insulator-to/from metal transition (IMT)" liner. In the present application, an entirety of, or a portion of, the IMT liner may be changed from an insulating phase to a conductive phase by increasing the temperature (i.e., heating) of the liner so as to provide a redundancy path in which electrons can flow.

In one aspect of the present application, an interconnect structure is provided. In one embodiment, the interconnect structure includes an electrically conductive structure embedded in an interconnect dielectric material layer. An insulator-to/from metal transition (IMT) liner is located between the electrically conductive structure and the interconnect dielectric material layer. The IMT liner is composed of a phase change material that is insulating at a first temperature, and becomes conductive at a second temperature that is higher than the first temperature.

In some embodiments, the IMT liner provides a shunting path (i.e., a redundancy electrical path) when the electrically conductive structure fails. In another embodiment, the IMT liner becomes a conductive shunt for current in an area in which a void is formed during an electromigration event.

In another aspect of the present application, a method of forming an interconnect structure is provided. In one embodiment, the method may include providing an opening in an interconnect dielectric material layer. An insulator-to/from metal transition (IMT) layer is formed on the interconnection dielectric material layer and within the opening. In accordance with the present application, the IMT layer is composed of a phase change material that is insulating at a first temperature, and becomes conductive at a second temperature that is higher than the first temperature. An electrically conductive metal or metal alloy layer is formed on the IMT layer. A planarization process is then performed to remove the IMT layer and the electrically conductive metal or metal alloy layer outside of the opening.

BRIEF DESCRIPTION OF SEVERAL VIEWS OF THE DRAWINGS

FIG. 11 is a cross sectional view of the interconnect structure of FIG. 10 after performing a planarization process.

FIG. 12 is a top-down, enlarged view of the exemplary interconnect structure of FIG. 4 after heating the IMT layer that remains in the opening to provide a shunting path when the electrically conductive metal or metal alloy layer that remains in the opening fails.

FIG. 13 is a top-down, enlarged view of the exemplary interconnect structure of FIG. 4 after heating the IMT layer that remains in the opening to provide a conductive shunt for current in an area in which a void is formed during an electromigration event.

DETAILED DESCRIPTION

Figure 1:
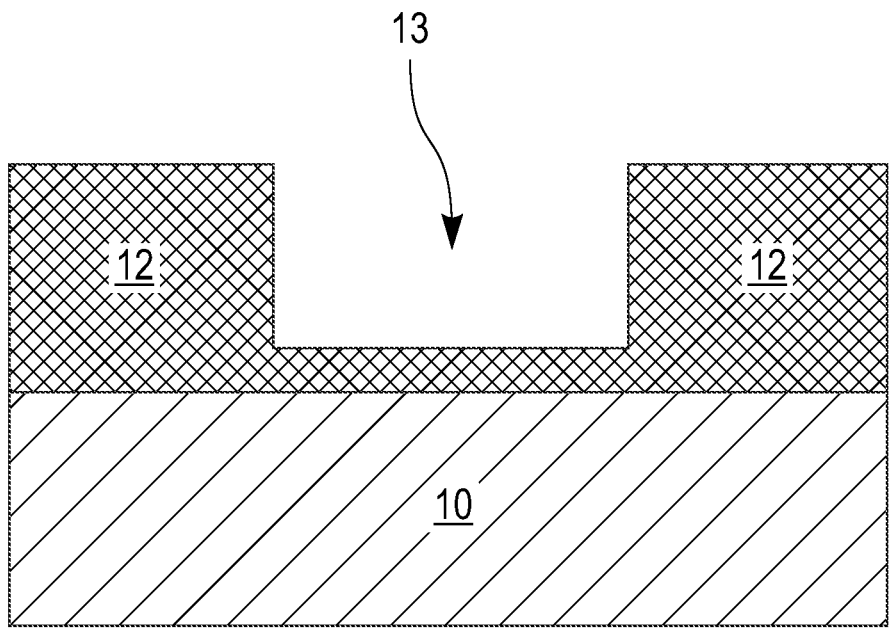
FIG. 1 is a cross sectional view of an exemplary interconnect structure of the present application during an early stage of fabrication and including an interconnect dielectric material layer having an opening.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary interconnect structure of the present application during an early stage of fabrication and including an interconnect dielectric material layer 12 having an opening 13. The interconnect dielectric material layer 12 represents one interconnect level of a multilevel interconnect structure.

The interconnect dielectric material layer 12 is formed upon a substrate 10. Substrate 10 may be a semiconductor substrate that contains a front-end-of-the-line device level containing one or more semiconductor devices disposed therein. The substrate 10 may include one or more lower interconnect levels of a multilayered interconnect structure that are formed above a front-end-of-the-line device level that contains one or more semiconductor devices. The one or more semiconductor devices may include transistors, capacitors, and/or resistors. The one or more semiconductor devices that are present in the front-end-of-the-line device level can be formed utilizing processes well known to those skilled in the art. The one or more interconnect levels that may provide substrate 10 include one or more electrically conductive structures embedded in one or more interconnect dielectric material layers.

The interconnect dielectric material layer 12 may be composed of an inorganic dielectric material or an organic dielectric material. In some embodiments, the interconnect dielectric material layer 12 may be porous. In other embodiments, the interconnect dielectric material layer 12 may be non-porous. Examples of suitable dielectric materials that may be employed as the interconnect dielectric material layer 12 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The interconnect dielectric material layer 12 may have a dielectric constant (all dielectric constants mentioned herein are measured relative to a vacuum, unless otherwise stated) that is about 4.0 or less. In one embodiment, the interconnect dielectric material layer 12 has a dielectric constant of 2.8 or less. These dielectrics generally having a lower parasitic cross talk as compared to dielectric materials whose dielectric constant is greater than 4.0.

The interconnect dielectric material layer 12 may be formed by a deposition process such as, for example, chemical vapor deposition (CVD), plasma enhanced chemical vapor deposition (PECVD) or spin-on coating. The interconnect dielectric material layer 12 may have a thickness from 50 nm to 250 nm. Other thicknesses that are lesser than 50 nm, and greater than 250 nm can also be employed in the present application.

After providing the interconnect dielectric material layer 12, an opening 13 is formed into the interconnect dielectric material layer 12. The opening 13 that is formed into the interconnect dielectric material layer 12 may be a via opening, a line opening and/or a combined via/line opening. The opening 13 may be formed by lithography and etching. In embodiments in which a combined via/line opening is formed, a second iteration of lithography and etching may be used to form such a combined via/line opening. Although the present application describes and illustrates a single opening 13, a plurality of openings may be formed into the interconnect dielectric material layer 12. In some embodiments (as is shown), the opening 13 partially extends into the interconnect dielectric material layer 12. In another embodiment, the opening 13 completely extends through the entirety of the interconnect dielectric material layer 12. When a plurality of openings is formed into the interconnect dielectric material layer 12, the types and depths of the openings may vary depending upon the desired interconnect structure to be formed.

Figure 2:
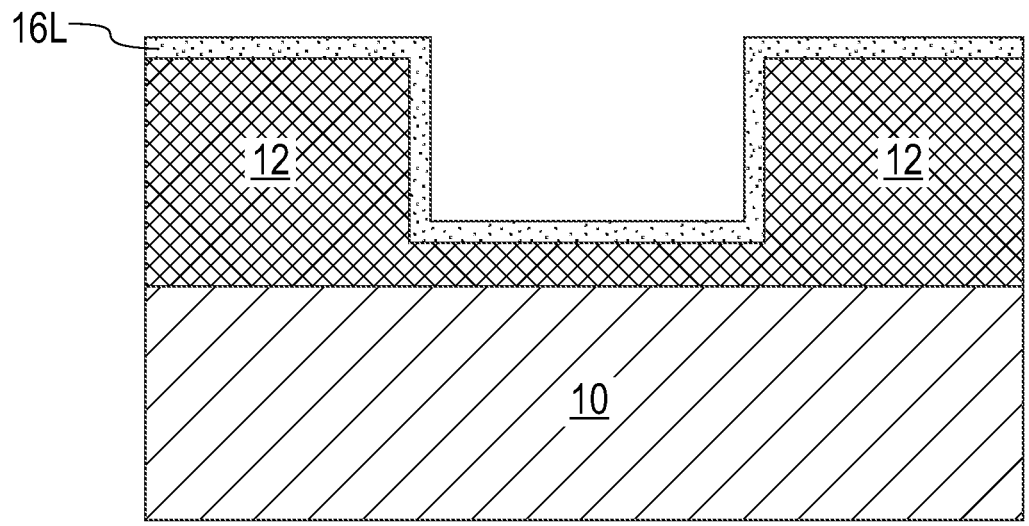
FIG. 2 is a cross sectional view of the exemplary interconnect structure of FIG. 1 after forming an insulator-to/from metal transition (IMT) layer on the interconnection dielectric material layer and within the opening.

Referring now to FIG. 2, there is illustrated the exemplary interconnect structure of FIG. 1 after forming an insulator-to/from metal transition (IMT) layer 16L on the interconnection dielectric material layer 12 and within the opening 13. The IMT layer 16L is a continuous layer that is formed on a topmost surface of the interconnection dielectric material layer 12 and along the sidewalls and bottom walls of the opening 13.

The IMT layer 16L that can be employed in the present application includes a phase change material that is insulating at a first temperature, and becomes conductive at a second temperature that is higher than the first temperature. In one example, the phase change material may be insulating up to a temperature of 150° C. (i.e., first temperature) and then it can be converted into a conductive material above 200° C. (i.e., second temperature). The transformation, i.e., phase change, temperature is tunable through the material composition design of the IMT layer 16L. Typically, the transformation temperature of the IMT layer 16L is between 100° C. and 500° C.

The IMT layer 16L may be composed of a metal oxide (such as, for example, a vanadium oxide, or a titanium oxide), NiTi, ZnAuCu, or alloys thereof.

The IMT layer 16L may have a thickness from 0.5 nm to 50 nm; although other thicknesses for the IMT layer 16L are contemplated and can be employed in the present application as long as the IMT layer 16L does not entirely fill the opening 13. The IMT layer 16L can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 3:
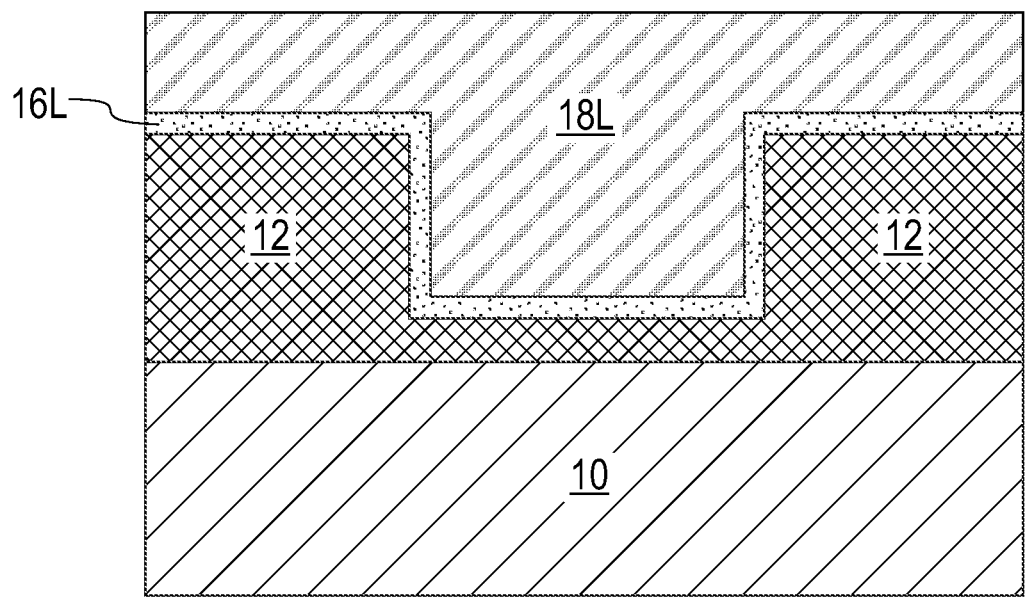
FIG. 3 is a cross sectional view of the exemplary interconnect structure of FIG. 2 after forming an electrically conductive metal or metal alloy layer on the IMT layer.

Referring now to FIG. 3, there is illustrated the exemplary interconnect structure of FIG. 2 after forming an electrically conductive metal or metal alloy layer 18L on the IMT layer 16L. In this embodiment, the electrically conductive metal or metal alloy layer 18L is formed directly on the IMT layer 16L and the IMT layer 16L has a first surface that directly contacts the interconnect dielectric material layer 12 and a second surface opposite the first surface that directly contacting the electrically conductive metal or metal alloy layer 18L.

The electrically conductive metal or metal alloy layer 18L may be composed of copper (Cu), aluminum (Al), tungsten (W), or an alloy thereof such as, for example, a Cu—Al alloy. The electrically conductive metal or metal alloy layer 18L can be formed utilizing a deposition process such as, for example, CVD, PECVD, sputtering, chemical solution deposition or plating. In one embodiment, a bottom-up plating process is employed in forming the first interconnect metal or metal alloy.

Figure 4:
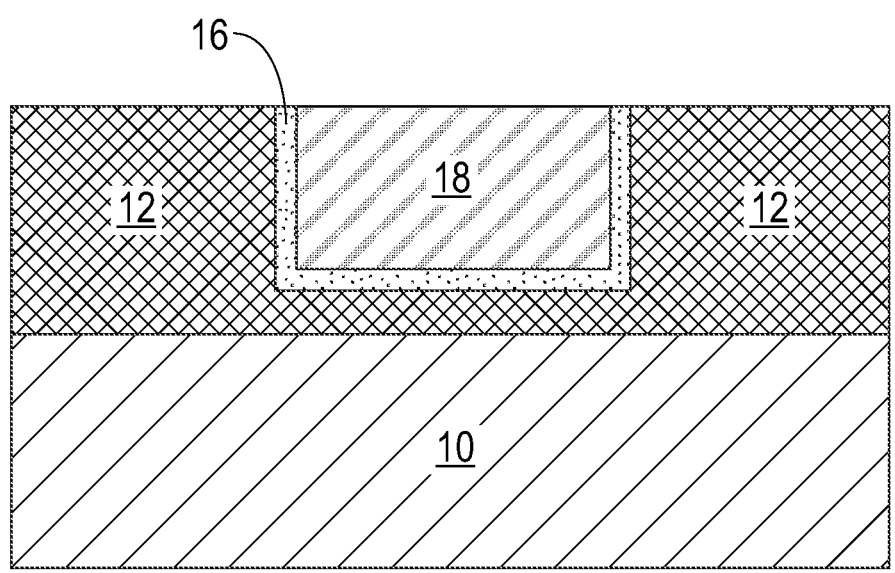
FIG. 4 is a cross sectional view of the exemplary interconnect structure of FIG. 3 after performing a planarization process.

Referring now to FIG. 4, there is illustrated the exemplary interconnect structure of FIG. 3 after performing a planarization process. The planarization process may include, for example, chemical mechanical polishing (CMP) and/or grinding. In this embodiment, the planarization process removes the electrically conductive metal or metal alloy layer 18L and the IMT layer 16L that are present outside opening 13 stopping on the topmost surface of the interconnect dielectric material layer 12. After planarization, a portion of the electrically conductive metal or metal alloy layer 18L and a portion of the IMT layer 16L remain in the opening. The portion of the electrically conductive metal or metal alloy layer 18L that remains in the opening 13 after planarization is referred to herein as an electrically conductive structure 18, while the portion of the IMT layer 16L that remains in the opening after planarization is referred to herein as an IMT liner 16. The electrically conductive structure 18 and the IMT liner 16 are embedded in the interconnect dielectric material layer 12. In some embodiments, the IMT liner 16 is U-shaped. By "U-shaped" it is meant a material has horizontal portion that contains a vertical portion that extends upward from each end of the horizontal portion.

In this embodiment, of the present application, the IMT liner 16 has a topmost surface that is coplanar with a topmost surface of the electrically conductive structure 18 and with the topmost surface of the interconnect dielectric material layer 12. Moreover, and in this embodiment, the IMT liner 16 has a first surface in direct physical contact with the electrically conductive structure 18, and a second surface opposite the first surface that is in direct physical contact with the interconnect dielectric material layer 12.

The IMT liner 16 is typically insulating at this point of the present application. Phase change of the IMT liner 16 from insulating to conductive may occur during a later heat treatment process in which the IMT liner 16 is subjected to a raise in temperature. In one embodiment, the heat treatment process may cause phase change (from insulating to conductive) of the entirety of IMT liner 16. In another embodiment, the heat treatment process may cause phase change (from insulating to conductive) of only a portion of the IMT liner 16; the remaining portion of the IMT liner 16 that is not subjected to the heat treatment process remains insulating.

Figure 5:
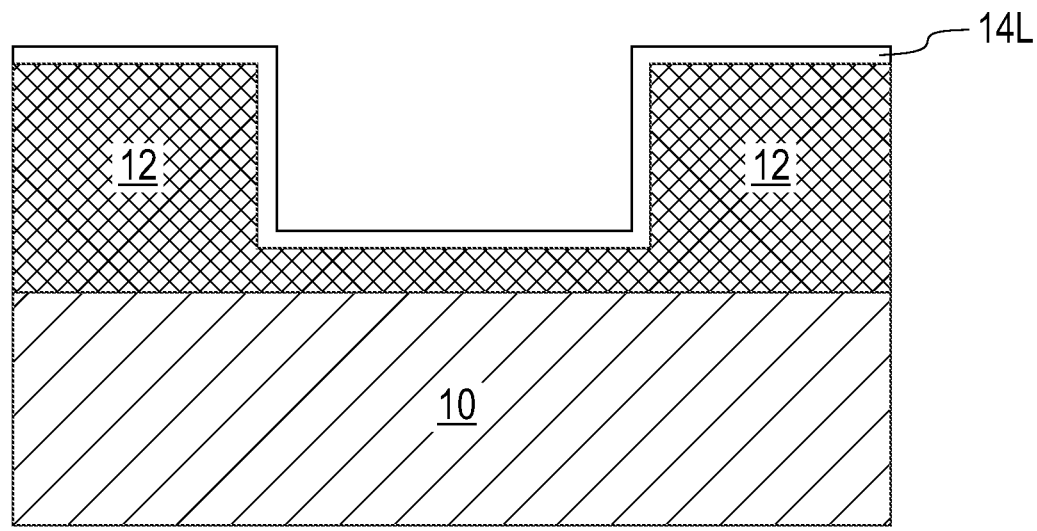
FIG. 5 is a cross sectional view of the exemplary interconnect structure of FIG. 1 after forming a diffusion barrier layer on the interconnection dielectric material layer and within the opening in accordance with an alternative embodiment of the present application.

Referring now to FIG. 5, there is illustrated the exemplary interconnect structure of FIG. 1 after forming a diffusion barrier layer 14L on the interconnection dielectric material layer 12 and within the opening 13 in accordance with an alternative embodiment of the present application. The diffusion barrier layer 14L is a continuous layer that is formed on a topmost surface of the interconnection dielectric material layer 12 and along the sidewalls and bottom walls of the opening 13.

The diffusion barrier layer 14L is composed of a conductive diffusion barrier material such as Ta, TaN, Ti, TiN, Ru, RuN, RuTa, RuTaN, W, WN or any other material that can serve as a barrier to prevent an electrically conductive metal or metal alloy from diffusing there through. The diffusion barrier layer 14L may have a thickness from 2 nm to 50 nm; although other thicknesses for the diffusion barrier layer 14L are contemplated and can be employed in the present application as long as the diffusion barrier layer 14L does not entirely fill the opening 13. The diffusion barrier layer 14L can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 6:
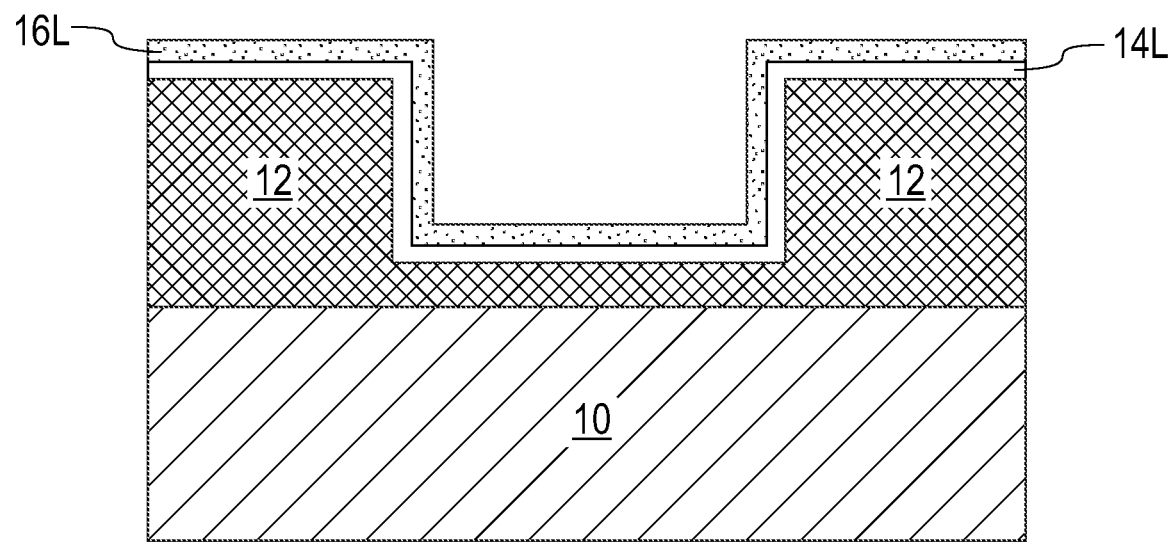
FIG. 6 is a cross sectional view of the exemplary interconnect structure of FIG. 5 after forming an insulator-to/from metal transition (IMT) layer on the diffusion barrier layer.

Referring now to FIG. 6, there is illustrated the exemplary interconnect structure of FIG. 5 after forming an insulator-to/from metal transition (IMT) layer 16L on the diffusion barrier layer 14L. In this embodiment, the diffusion barrier layer 14L is positioned between the IMT layer 16L and the interconnect dielectric material layer 12. The IMT layer 16L of this embodiment of the present application is the same as the IMT layer 16L of the previous embodiment of the present application.

Figure 7:
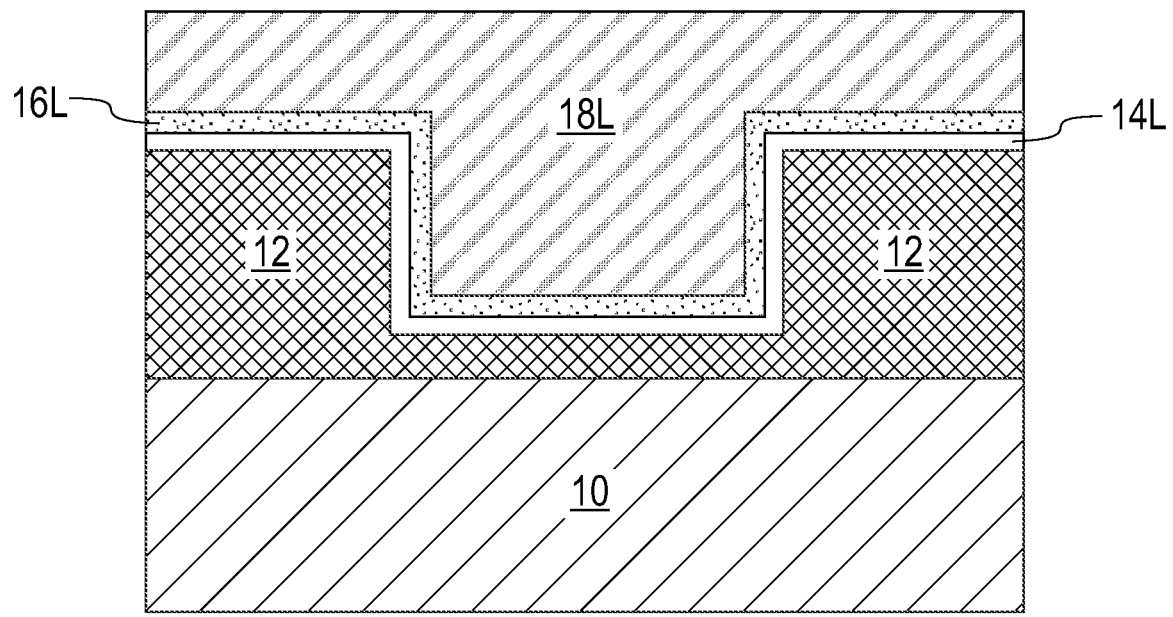
FIG. 7 is a cross sectional view of the exemplary interconnect structure of FIG. 6 after forming an electrically conductive metal or metal alloy layer on the IMT layer.

Referring now to FIG. 7, there is illustrated the exemplary interconnect structure of FIG. 6 after forming an electrically conductive metal or metal alloy layer 18L on the IMT layer 16L. The electrically conductive metal or metal alloy layer 18L of this embodiment is the same as the electrically conductive metal or metal alloy layer 18L of the previous embodiment of the present application.

Figure 8:
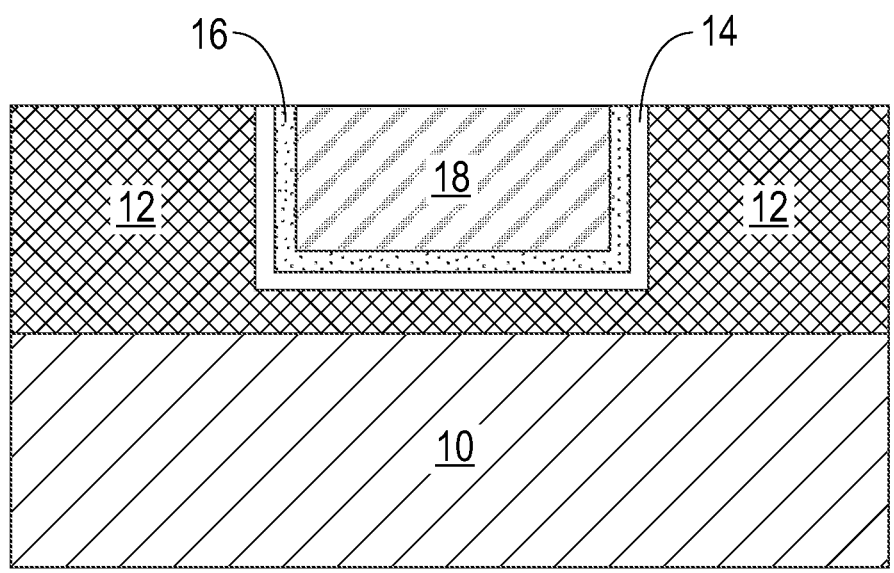
FIG. 8 is a cross sectional view of the interconnect structure of FIG. 7 after performing a planarization process.

Referring now to FIG. 8, there is illustrated the interconnect structure of FIG. 7 after performing a planarization process. The planarization process may include, for example, chemical mechanical polishing (CMP) and/or grinding. In this embodiment, the planarization process removes the electrically conductive metal or metal alloy layer 18L, the IMT layer 16L and the diffusion barrier layer 14L that are present outside opening 13 stopping on the topmost surface of the interconnect dielectric material layer 12. After planarization, a portion of the electrically conductive metal or metal alloy layer 18L, a portion of the IMT layer 16L and a portion of the diffusion barrier layer 14L remain in the opening. The portion of the electrically conductive metal or metal alloy layer 18L that remains in the opening 13 after planarization is referred to herein as an electrically conductive structure 18, the portion of the IMT layer 16L that remains in the opening after planarization is referred to herein as an IMT liner 16, and the portion of the diffusion barrier layer 14L that remains in the opening after planarization is referred herein as a diffusion barrier liner 14. The electrically conductive structure 18, the IMT liner 16 and the diffusion barrier liner 14 are embedded in the interconnect dielectric material layer 12. In some embodiments, the IMT liner 16 and the diffusion barrier liner 14 are U-shaped.

In this embodiment of the present application, the IMT liner 16 has a topmost surface that is coplanar with a topmost surface of the electrically conductive structure 18 and with a topmost surface of the diffusion barrier liner 14 as well as with the topmost surface of the interconnect dielectric material layer 12. Moreover, and in this embodiment, the IMT liner 16 has a first surface in direct physical contact with the electrically conductive structure, and a second surface opposite the first surface that is in direct physical contact with the diffusion barrier liner 14.

The IMT liner 16 is typically insulating at this point of the present application. Phase change of the IMT liner 16 from insulating to conductive may occur during a later heat treatment process in which the IMT liner 16 is subjected to a raise in temperature. In one embodiment, the heat treatment process may cause phase change (from insulating to conductive) of the entirety of IMT liner 16. In another embodiment, the heat treatment process may cause phase change (from insulating to conductive) of only a portion of the IMT liner 16; the remaining portion of the IMT liner 16 not subjected to the heat treatment process remains insulating.

Figure 9:
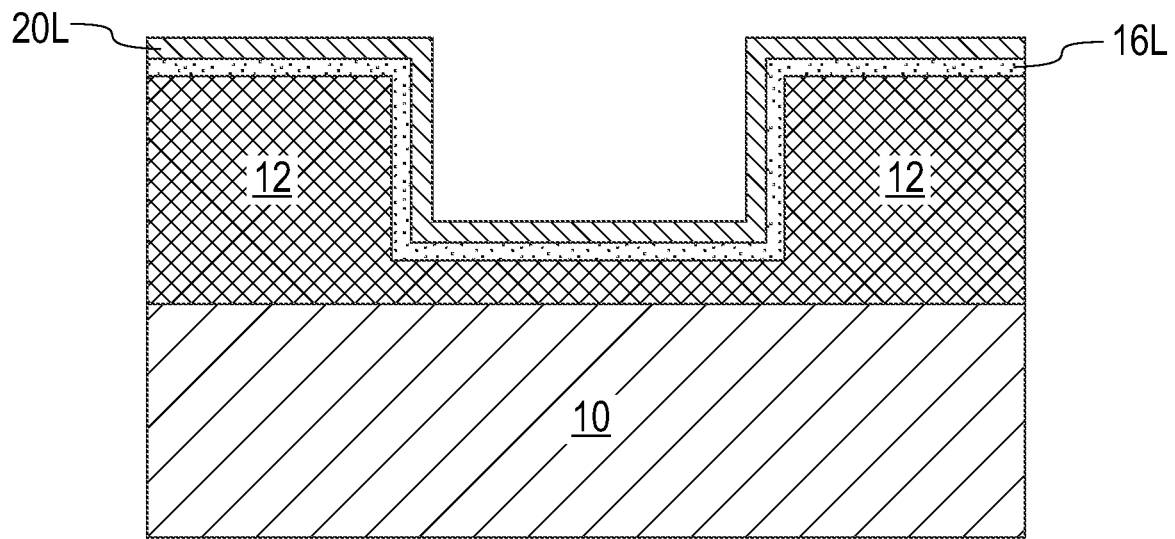
FIG. 9 is a cross sectional view of the exemplary interconnect structure of FIG. 2 after forming a diffusion barrier layer on the IMT layer.

Referring now to FIG. 9, there is illustrated the exemplary interconnect structure of FIG. 2 after forming a diffusion barrier layer 20L on the IMT layer 16L in accordance with yet another embodiment of the present application. In this embodiment, the IMT layer 16L has a first surface that directly contacts the interconnect dielectric material layer 12 and a second surface opposite the first surface that directly contacts the diffusion barrier layer 20L.

Diffusion barrier layer 20L is a continuous layer that is formed on the entirety of the IMT layer 16L. The diffusion barrier layer 20L of this embodiment may include one of the conductive diffusion barrier materials mentioned above for diffusion barrier layer 14L. Diffusion barrier layer 20L may have a thickness within the range mentioned above for diffusion barrier layer 14L and diffusion barrier layer 20L may be formed utilizing one of the deposition processes mentioned above for providing diffusion barrier layer 14L.

Figure 10:
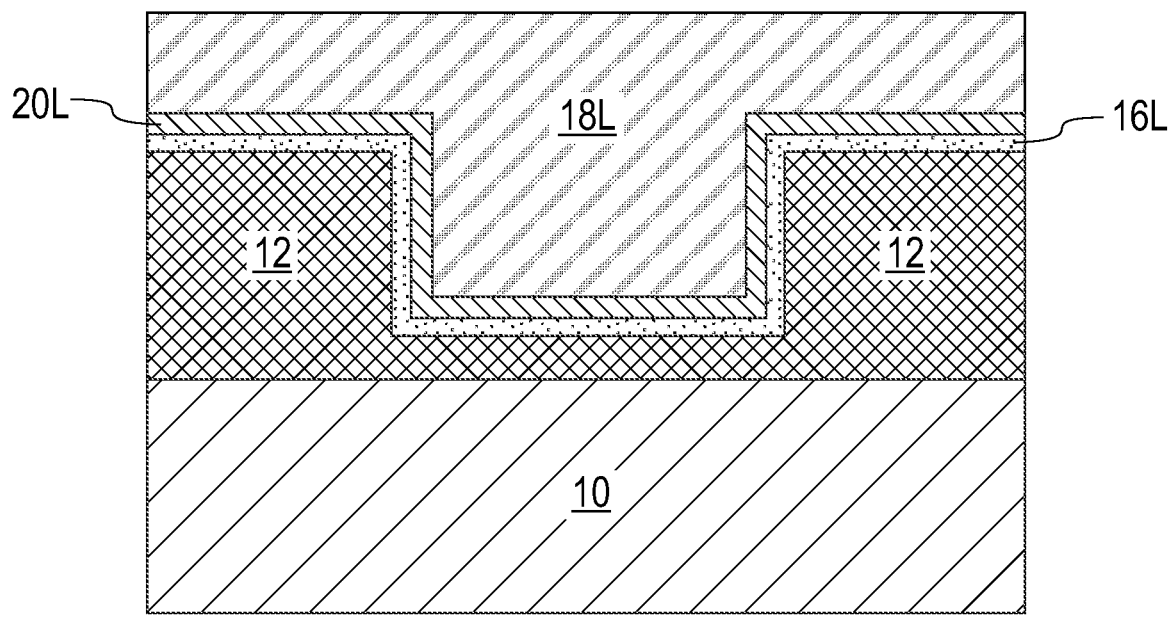
FIG. 10 is a cross sectional view of the exemplary interconnect structure of FIG. 6 after forming an electrically conductive metal or metal alloy layer on the diffusion barrier layer.

Referring now to FIG. 10, there is illustrated the exemplary interconnect structure of FIG. 6 after forming an electrically conductive metal or metal alloy layer 18L on the diffusion barrier layer 20L. The electrically conductive metal or metal alloy layer 18L of this embodiment is the same as the electrically conductive metal or metal alloy layer 18L of the previous embodiment of the present application.

Referring now to FIG. 11, there is illustrated the interconnect structure of FIG. 10 after performing a planarization process. The planarization process may include, for example, chemical mechanical polishing (CMP) and/or grinding. In this embodiment, the planarization process removes the electrically conductive metal or metal alloy layer 18L, the diffusion barrier layer 204L, and the IMT layer 16L that are present outside opening 13 stopping on the topmost surface of the interconnect dielectric material layer 12. After planarization, a portion of the electrically conductive metal or metal alloy layer 18L, a portion of the diffusion barrier layer 20L and a portion of the IMT layer 16L remain in the opening 13. The portion of the electrically conductive metal or metal alloy layer 18L that remains in the opening 13 after planarization is referred to herein as an electrically conductive structure 18, the portion of the IMT layer 16L that remains in the opening after planarization is referred to herein as a IMT liner 16, and the portion of the diffusion barrier layer 20L that remains in the opening after planarization is referred herein as a diffusion barrier liner 20. The electrically conductive structure 18, the IMT liner 16 and the diffusion barrier liner 14 are embedded in the interconnect dielectric material layer 12. In some embodiments, the IMT liner 16 and the diffusion barrier liner 20 are U-shaped.

In this embodiment of the present application, the IMT liner 16 has a topmost surface that is coplanar with a topmost surface of the electrically conductive structure 18 and with a topmost surface of the diffusion barrier liner 20 as well as with the topmost surface of the interconnect dielectric material layer 12. Moreover, and in this embodiment, the IMT liner 16 has a first surface in direct physical contact with diffusion barrier liner 20, and a second surface opposite the first surface that is in direct physical contact with the interconnect dielectric material layer 12.

The IMT liner 16 is typically insulating at this point of the present application. Phase change of the IMT liner 16 from insulating to conductive may occur during a later heat treatment process in which the IMT liner 16 is subjected to a raise in temperature. In one embodiment, the heat treatment process may cause phase change (from insulating to conductive) of the entirety of IMT liner 16. In another embodiment, the heat treatment process may cause phase change (from insulating to conductive) of only a portion of the IMT liner 16; the remaining portion of the IMT liner that is not subjected to the heat treatment process remains insulating.

Referring now to FIG. 12, there is illustrated a top-down, enlarged view of the exemplary interconnect structure of FIG. 4 after heating the IMT liner 16 to provide a shunting path when the electrically conductive structure 18 fails. In this embodiment, element 16X denotes the phased changed conductive material. Heating may be performed at a temperature of about 200° C. Phase change from insulating to conductive typically occurs over a temperature of 100° C.

Referring now to FIG. 13, there is illustrated a top-down, enlarged view of the exemplary interconnect structure of FIG. 4 after heating the IMT liner 16 that remains in the opening to provide a conductive shunt 16X for current in an area in which a void 25 is formed during an electromigration event. In this embodiment, the heating may performed by an electromigration induced joule heating which occurs during the formation of the void 25. Phase change from insulating to conductive typically occurs over a temperature of 100° C. In this embodiment, only a portion of the IMT liner 16 is changed from insulating to conductive, the remaining portion of the IMT liner 16 in areas in which the void 25 is absent remains an insulator material.

Although phase change is shown for the exemplary interconnect structure shown in FIG. 4 in both FIGS. 12 and 13, the interconnect structures shown in FIGS. 8 and 11 can also under similar phase change of the IMT liner 18.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming an interconnect structure, the method comprising:
   providing an opening in an interconnect dielectric material layer;
   forming an insulator-to/from metal transition (IMT) layer on a topmost surface of the interconnection dielectric material layer and on a sidewall and a bottom wall of the opening, wherein the IMT layer is composed of a phase change material that is insulating at a first temperature, and becomes conductive at a second temperature that is higher than the first temperature;
   forming an electrically conductive metal or conductive metal alloy layer on the IMT layer; and
   performing a planarization process to remove the IMT layer and the electrically conductive metal or conductive metal alloy layer outside of the opening, while maintaining the IMT layer and the electrically conductive metal or conductive metal alloy layer in the opening, wherein the IMT layer and the electrically conductive metal or conductive metal alloy layer that remain in the opening, after performing the planarization process, fill in an entirety of the opening.

2. The method of claim 1, wherein the IMT layer has a first surface in direct physical contact with the electrically conductive metal or conductive metal alloy layer, and a second surface opposite the first surface that is in direct physical contact with the interconnect dielectric material layer.

3. The method of claim 1, further comprising heating the IMT layer that remains in the opening to provide a shunting path when the electrically conductive metal or conductive metal alloy layer that remains in the opening fails.

4. The method of claim 1, further comprising heating the IMT layer that remains in the opening to provide a conductive shunt for current in an area in which a void is formed during an electromigration event.

5. The method of claim 4, wherein the IMT layer that remains in the opening and in areas in which the void is absent remains an insulator material.

6. The method of claim 1, wherein the IMT layer is composed of a vanadium oxide, a titanium oxide, NiTi, ZnAuCu, or alloys thereof.

7. The method of claim 1, further comprising a heat treatment process performed after the planarization, wherein the heat treatment process converts the IMT layer that remains in the opening from insulating to conductive.

8. The method of claim 7, wherein the heat treatment process converts an entirety of the IMT layer that remains in the opening after the planarization.

9. The method of claim 7, wherein the heat treatment process converts only a portion of the IMT layer that remains in the opening after the planarization.

10. The method of claim 1, wherein the IMT layer that remains in the opening after the planarization is U-shaped.

11. The method of claim 1, wherein the phase change material is insulating up to 150° C. and is conductive above 200° C.

12. The method of claim 1, wherein the phase change material is converted from insulating to conductive occurs at a temperature between 100° C. and 500° C.

13. The method of claim 1, wherein the IMT layer has a thickness from 0.5 nm to 50 nm.

14. The method of claim 1, wherein the electrically conductive metal or metal alloy comprises copper (Cu), aluminum (Al) or tungsten (W).

15. The method of claim 1, wherein the planarization comprises chemical mechanical polishing.

16. The method of claim 1, wherein after planarization, the IMT layer that remains in the opening has a topmost surface that is coplanar with a topmost surface of both the interconnect dielectric material layer and the conductive metal or conductive metal alloy that remains in the opening.

17. A method of forming an interconnect structure, the method comprising:
   providing an opening in an interconnect dielectric material layer;
   forming an insulator-to/from metal transition (IMT) layer on the interconnection dielectric material layer and within the opening, wherein the IMT layer is composed of a phase change material that is insulating at a first temperature, and becomes conductive at a second temperature that is higher than the first temperature;
   forming a diffusion barrier layer directly on, and in direct physical contact with, the IMT layer;
   forming an electrically conductive metal or conductive metal alloy layer directly on, and in direct physical contact with, the IMT layer; and
   performing a planarization process to remove the IMT layer, the diffusion barrier layer and the electrically conductive metal or conductive metal alloy layer outside of the opening, while maintaining the IMT layer, the diffusion barrier layer and the electrically conductive metal or conductive metal alloy layer in the opening.

18. A method of forming an interconnect structure, the method comprising:
   providing an opening in an interconnect dielectric material layer;
   forming a diffusion barrier layer directly on a topmost surface of the interconnect dielectric material layer and directly on a sidewall and a bottom wall of the opening,
   forming an insulator-to/from metal transition (IMT) layer directly on, and in direct physical contact with the diffusion barrier layer, wherein the IMT layer is composed of a phase change material that is insulating at a first temperature, and becomes conductive at a second temperature that is higher than the first temperature;
   forming an electrically conductive metal or conductive metal alloy layer directly on, and in direct physical contact with, the IMT layer; and
   performing a planarization process to remove the diffusion barrier layer, the IMT layer and the electrically conductive metal or conductive metal alloy layer outside of the opening, while maintaining the diffusion barrier layer, the IMT layer, and the electrically conductive metal or conductive metal alloy layer in the opening.

* * * * *